United States Patent [19]
Cole, Jr. et al.

[11] Patent Number: 5,434,751
[45] Date of Patent: Jul. 18, 1995

[54] REWORKABLE HIGH DENSITY INTERCONNECT STRUCTURE INCORPORATING A RELEASE LAYER

[75] Inventors: Herbert S. Cole, Jr., Burnt Hills; Theresa A. Sitnik-Nieters, Scotia; Robert J. Wojnarowski, Ballston Lake, all of N.Y.; John H. Lupinski, Vienna, Va.

[73] Assignee: Martin Marietta Corporation, Philadelphia, Pa.

[21] Appl. No.: 225,876

[22] Filed: Apr. 11, 1994

[51] Int. Cl.⁶ .............................................. H05K 1/11
[52] U.S. Cl. ...................... 361/792; 29/846; 156/289; 174/259
[58] Field of Search ............. 25/846, 623.3; 156/289, 156/239, 230; 174/250, 255, 256, 258, 259, 260; 257/684, 700, 723, 724; 361/792, 795; 439/68, 44, 47; 428/40, 352, 901, 202

[56] References Cited

U.S. PATENT DOCUMENTS

| | | | |
|---|---|---|---|
| 4,783,695 | 11/1988 | Eichelberger | 257/700 |
| 4,859,512 | 8/1985 | Jones et al. | 156/289 |
| 4,933,042 | 6/1990 | Eichelberger | 156/239 |
| 5,073,814 | 12/1991 | Cole, Jr. | 357/54 |
| 5,157,589 | 10/1992 | Cole, Jr. | 361/792 |
| 5,161,093 | 11/1992 | Gorczyca | 361/792 |

OTHER PUBLICATIONS

IBM Technical Disclosure Bulletin "Interconnection Alignment Multichip Module" by Balderes et al. vol. 15 No. 10 Mar. 1973 (p. 3024).

*Primary Examiner*—Leo P. Picard
*Assistant Examiner*—Donald Sparks
*Attorney, Agent, or Firm*—Brian J. Rees; Geoffrey H. Krauss

[57] ABSTRACT

A multichip module (incorporating a high density interconnect structure) has: a first portion containing a substrate with semiconductor chips therein, with each chip having contact pads; a second portion comprising a (HDI) structure interconnecting the chip pads; and a solvent-soluble release layer bonding the two portions together and allowing for easy removal of the HDI structure from the substrate of the module by immersion in an appropriate solvent for the release layer.

17 Claims, 3 Drawing Sheets

REWORKABLE HIGH DENSITY INTERCONNECT STRUCTURE INCORPORATING A RELEASE LAYER

BACKGROUND OF THE INVENTION

A high density interconnect (HDI) structure offers many advantages in the compact assembly of electronic systems. For example, a multi-chip electronic system (such as a micro computer incorporating 30–50 chips) can be fully assembled and interconnected by a suitable HDI structure on a single substrate, to form a unitary package which is 2 inches long by 2 inches wide by 0.050 inches thick. Even more important, the interconnect structure can be disassembled from the substrate for repair or replacement of a faulty component and then reassembled without significant risk to the good components incorporated within the system. This is particularly important where many (e.g., 50) chips, each having a cost on the order of $2,000, may be incorporated in a single system on one substrate. This repairability feature is a substantial advance over prior connection systems in which reworking the system to replace damaged components was either impossible or involved substantial risk to the good components.

Briefly, in this high density interconnect structure, a ceramic substrate such as alumina which may be 50 to 100 mils thick and of appropriate size and strength for the overall system, is provided. This size is typically less than 2 inches square, but may be made larger or smaller. Once the position of the various chips has been specified, individual cavities or one large cavity having appropriate depth at the intended locations of differing chips, is prepared. This may be done by starting with a bare substrate having a uniform thickness and the desired size. Conventional, ultrasonic or laser milling may be used to form the cavities in which the various chips and other components will be positioned. For many systems where it is desired to place chips nearly edge-to-edge, a single large cavity is satisfactory. That large cavity may typically have a uniform depth where the semiconductor chips have a substantially uniform thickness. The cavity bottom may be made respectively deeper or shallower at a location where a particularly thick or thin component will be placed, so that the upper surface of the corresponding component is in substantially the same plane as the upper surface of the rest of the components and the portion of the substrate which surrounds the cavity. The bottom of the cavity is then provided with a thermoplastic adhesive layer, which may preferably be a polyetherimide resin (such as ULTEM ® 6000 resin, available from the General Electric Company, Fairfield, Conn.). The various components are then placed in their desired locations within the cavity, and the entire structure is heated to remove solvent and thermoplastically bond the individual components to the substrate. Thereafter, a polyimide film (which may be KAPTON ® polyimide, available from E.I. du Pont de Nemours Company, Wilmington, Del.), of a thickness of approximately 0.0003–0.005 inches (approx. 12.5–75 microns), is pretreated by reactive ion etching (RIE) to promote adhesion. The substrate and chips are then coated with ULTEM ® 1000 polyetherimide resin or another thermoplastic adhesive and the KAPTON ® resin film is laminated across the top of the chips, any other components and the substrate. The ULTEM ® resin serves as a thermoplastic adhesive to hold the KAPTON ® resin film in place. Thereafter, via holes are provided (preferably by laser dithering, such as described in U.S. Pat. No. 4,714,516, herein incorporated by reference) through the KAPTON ® resin film and ULTEM ® resin layers, at locations in alignment with the contact pads on the electronic components to which it is desired to make contact. A metallization layer is deposited over the KAPTON ® resin layer and extends into the via holes to make electrical contact to the contact pads disposed thereunder. This metallization layer may be patterned to form individual conductors during the deposition process or may be deposited as a continuous layer and then patterned using photoresist and etching. The photoresist is preferably exposed using a laser to provide an accurately aligned conductor pattern at the end of the process. Alternatively, exposure through a mask may be used.

Additional dielectric and metallization layers are provided as required in order to provide all of the desired electrical connections among the chips. Any misposition of the individual electronic components and their contact pads is compensated for by an adaptive laser lithography system which is the subject of some of the patents and applications listed hereinafter.

This high density interconnect structure provides many advantages. Included among these are the lightest weight and smallest volume packaging of such an electronic system presently available. A further, and possibly more significant, advantage of this high density interconnect structure, is the short time required to design and fabricate a system using this high density interconnect structure. Prior art processes require the prepackaging of each semiconductor chip, the design of a multilayer circuit board to interconnect the various packaged chips, and so forth. Multilayer circuit boards are expensive and require substantial lead time for their fabrication. In contrast, the only thing which must be specially pre-fabricated for the HDI system is the substrate on which the individual semiconductor chips will be mounted. This substrate is a standard stock item, other than the requirement that the substrate have appropriate cavities therein for the placement of the semiconductor chips so that the interconnect surface of the various chips and the substrate will be in a single plane. In the HDI process, the required cavities may be formed in an already fired ceramic substrate by conventional or laser milling. This process is straight-forward and fairly rapid with the result that once a desired configuration of the substrate has been established, a corresponding physical substrate can be made ready for the mounting of the semiconductor chips in as little as 1 day and typically 4 hours for small quantities as are suitable for research or prototype systems to confirm the design prior to quantity production.

The process of designing an interconnection pattern for interconnecting all of the chips and components of an electronic system on a single high density interconnect substrate normally takes somewhere between one week and five weeks. Once that interconnect structure has been defined, assembly of the system on the substrate and the overlay structure is built-up on top of the chips and substrate, one layer at a time. Typically, the entire process can be finished in one day and, in the event of a high priority rush, could be completed in approximately four hours (as described in U.S. patent Ser. No. 07/363,646). Consequently, this high density interconnect structure not only results in a substantially lighter weight and more compact package for an electronic system, but enables a prototype of the system to be fabricated and tested in a much shorter time than is required with other packaging techniques.

This high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 5,127,998, entitled "Area-Selective Metallization Process" by H. S. Cole et al.; U.S. patent application Ser. No. 07/459,844, entitled "Area-Selective Metallization Process" by H. S. Cole, et al.; U.S. Pat. No. 5,169,678, entitled "Locally Orientation Specific Routing System" by T. R. Haller, et al.; and U.S. Pat. No. 5,108,825, entitled "An Epoxy/Polyimide Copolymer Blend Dielectric and Layered Circuits Incorporating It" by C. W. Eichelberger, et al. Each of these Patents and Patent Applications, including the references contained therein, is hereby incorporated in its entirety by reference.

Any additional dielectric layers for isolation between the first metallization layer and any subsequent metallization layers are added by spinning on or spraying on a solvent solution of a desired dielectric adhesive material onto a thermosetting KAPTON ® resin layer. Unfortunately, there are a limited number of dielectric materials which are suitable for use as these adhesive layers because of all the material properties the additional layers must exhibit. Any candidate layer must provide good adhesion to the underlying dielectric and metallization and to overlying KAPTON ® resin layer, and should also be inherently laser ablatable or should be rendered laser ablatable in accordance with U.S. Pat. No. 5,169,678 entitled, "Laser Ablatable Polymer dielectrics and Methods."

In the construction of microelectronics circuitry, polymeric materials are used both in adhesive and in dielectric layers. The requirements for these polymeric materials differ depending on where in the structure they are placed. Epoxies are generally good adhesives but due to their thermosetting properties they are brittle and inflexible when fully cured and cannot be easily redissolved. Polyimides have attractive dielectric characteristics but they often require high processing temperatures and application from strong polar solvents. Types utilized in the present invention include: thermoplastic materials, thermosetting materials, and a combination of the two, which although referred to hereinafter as thermosetting, does have flexibility due to the thermoplastic additive.

By a thermoplastic polymer material, we mean a polymer material which after multiple cycles of heating and cooling substantially retains its initial melting point, or glass transition temperature ($T_g$). That is, upon cooling from above the $T_g$, there is no change in the chemical or physical properties of the polymers. The glass transition temperature of a polymer is the temperature above which the viscosity of the polymer decreases greatly, thereby allowing the polymer to flow and also to bond to other materials. When cooled below this glass transition temperature, the thermoplastic polymer "resolidifies" and remains adherent to objects with which it is in intimate contact. If multiple dielectric layer of this material are coated, the solvent vehicle tends to redissolve the surface portion of an already formed, unreacted, thermoplastic dielectric layer on which it is disposed. While this tends to improve adhesion, it can also result in excessive interfacial stress and cracking or crazing of the dielectric layers which renders the structure unusable. Thus, this process of coating multiple dielectric layers of thermoplastic materials is not preferred.

By a thermoset polymer, we mean a polymer material in which cross-linking takes place the first time it is heated or during its preparation process, such that the material either no longer melts or melts at a much higher temperature than it did prior to its initial heating or its formation and is rendered insoluble. While use of a thermoset structure is beneficial in the printed circuit board art, the use of such thermoset systems has historically been unacceptable in a high density interconnect structure of the type to which this invention is directed, because expensive chips are put in place before the interconnection is built, so that any fault in a thermoset high density interconnect structure would require scrapping not only of the interconnection structure itself, but all of the chips as well.

There are a class of materials which combine the properties of thermosetting and thermoplastic materials. One example is a siloxane-polyimide material (SPI, available from MicroSi, Phoenix, Ariz.). This thermoplastic polyimide is fully imidized and characterized by low $T_g$ (135° C.) as well as by excellent adhesion to KAPTON ® film, metal, and to itself. Combining crosslinkable epoxies with thermoplastic materials such as SPI results in an insoluble adhesive blend with structural rigidity. U.S. Pat. No. 5,108,825, entitled "Epoxy/Polyimide Copolymer Blend Dielectric and Layered Circuits Incorporating It", disclosed a copolymer blend of a cycloaliphatic epoxy and a polyimide which can only be applied from solution for use in a dielectric layer of a multilayer interconnect structure. However, these materials are unstable at higher temperatures due to its relatively low $T_g$.

The use of multiple KAPTON ® resin dielectric layers which are laminated to the structure using a thermoplastic adhesive to provide such a multilayer structure in which each dielectric layer includes a KAPTON ® resin upper sublayer and a thermoplastic lower sublayer, as discussed in U.S. Pat. No. 4,783,695, has not been implemented because of the tendency for the early laminated layers to shift, deform, or otherwise change during the lamination of subsequent layers in a way which breaks via connections between layers.

U.S. Pat. No. 5,157,589, entitled "Multiple Lamination High Density Interconnect Process and Structure Employing Thermoplastic Adhesives Having Sequentially Decreasing $T_g$s", teaches a high density interconnect structure incorporating a plurality of laminated dielectric layers using thermoplastic adhesive layers of progressively lower glass transition temperatures in order to facilitate the removal of only a portion of the high density interconnect structure. This removal of only a portion would occur by heating up the HDI unit to the $T_g$ of the adhesive of the layer needing removal. That layer and any layers further from the substrate would then be "peeled" away from the substrate. Unfortunately, as additional layers are added, the $T_g$s of adjacent levels become very close and there is a significant problem with shifting of material within the layers adjacent to the layer needing removal.

U.S. Pat. No. 5,161,093, entitled "Multiple Lamination High Density Interconnect Process and Structure Employing a Variable Crosslinking Adhesive", teaches a high density interconnect structure incorporating a plurality of laminated dielectric layers using a SPI/epoxy crosslinking copolymer blend (hereinafter referred to as SPIE) adhesive in order to facilitate stability of the structure during lamination of additional layers. There is also a thermoplastic release layer disclosed whereby one can heat up the module to the $T_g$ of the thermoplastic material and the levels above can be peeled away. It should be noted that the thermoplastic material must be first laminated at temperatures above 300° C., hence this process is rendered unusable for sensitive electronic components which cannot be heated above 200° C.

Consequently, an alternative module incorporating a high density structure and allowing for repairability which avoids the problems described above, is desirable.

OBJECTS OF THE INVENTION

Accordingly, a primary object of the present invention is to provide an easily repairable high density interconnect structure.

SUMMARY OF THE INVENTION

The above and other objects, which will become apparent from the specification as a whole, including the drawings, are accomplished in accordance with the present invention by using a solvent-soluble release layer to bond two portions together, with the capability of providing electrical connections between the two portions, while still allowing easy separation of the portions responsive to immersion in an appropriate solvent.

In accordance with the invention, a multichip module is fabricated by using a solvent-soluble release layer to bond two portions together; one portion contains the substrate and semiconductor chips and the other portion contains strata of the high density interconnect structure. Providing the solvent-soluble release layer between the substrate and the high density interconnect structure allows for the entire module to be processed at a temperature generally not exceeding 200° C., which is beneficial when working with temperature-sensitive semiconductor chips (GaAs or InSb).

In one embodiment of the invention, a multichip module is fabricated by using a solvent-soluble release layer to bond together a first portion containing the substrate, semiconductor chips and a part of the high density interconnect structure, and a second portion containing a remaining part of the high density interconnect structure. This allows the multichip module to be processed and tested up to the lower (ground and power) levels of the high density interconnect structure; if a fault is found in the final assembly, the upper (signal) layers can be easily removed and re-processed for faster turn around time.

In another embodiment of the invention, a stack of multichip modules, each module incorporating a substrate with an edge metal pad and a high density interconnect structure, is fabricated by using a release layer, soluble in a particular solvent, to bond together each of a plurality of modules; a different release layer, soluble in a different solvent, is used to attach a dielectric layer supporting a patterned metallization layer making interconnections between the edge metal pads on the substrates.

In yet another embodiment of the invention, a multichip module is bonded to a base using a release layer, soluble in a particular solvent, in conjunction with an epoxy adhesive.

BRIEF DESCRIPTION OF THE DRAWINGS

The subject matter which is regarded as the invention is particularly pointed out and distinctly claimed in the concluding portion of the specification. The invention, together with further objects and advantages thereof, may best be understood by reference to the following description taken in connection with the accompanying drawings in which:

DETAILED DESCRIPTION

Figure 1:
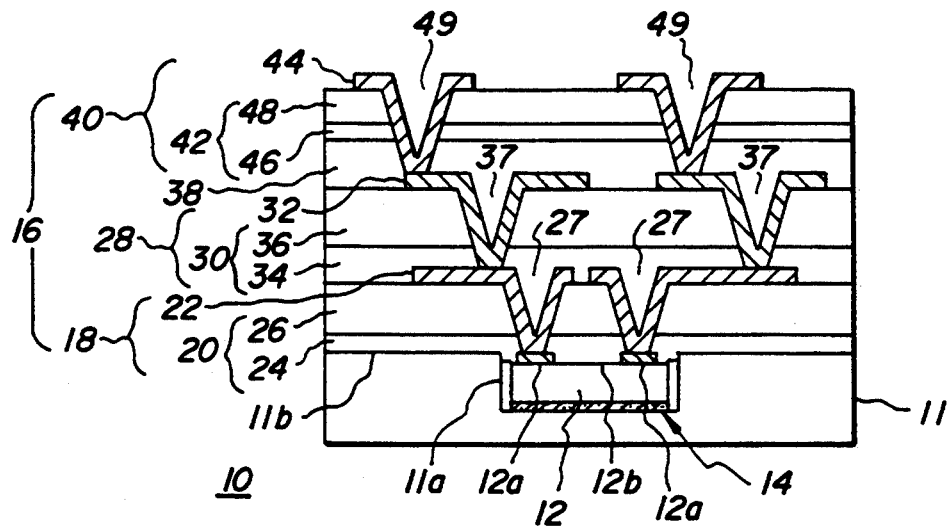
FIG. 1 is a cross-sectional view of a multichip module incorporating a high density interconnect structure having a solvent-soluble release layer between the second and third strata.

Referring initially to FIG. 1, a multichip module 10 has a substrate 11 with a plurality of chip cavities 11a formed therein, through a top surface 11b thereof. An integrated circuit chip 12 or another electronic component is disposed in each chipwell 11a. Electronic components 12 may be bonded to the substrate 11 with a layer of a thermoplastic adhesive 14; these electronic components 12 have contact pads 12a on an upper contact surface thereof 12b.

A high density interconnect structure 16 is fabricated above the chips 12 on the substrate upper surface 11b. A first stratum 18 of the overlying high density interconnect structure 16 comprises a dielectric layer 20 supporting a patterned metallization layer 22. The dielectric layer 20 has separate lower and upper sublayers 24 and 26, respectively, and supports the patterned metallization layer 22 which extends into contact with contact pads 12a on the substrate 11 within via holes 27 in the dielectric layer. The lower dielectric sublayer 24 is a thermoplastic adhesive having a first glass transition temperature $T_{g1}$. The upper dielectric sublayer 26 may be a thermoplastic material having a higher $T_g$, but is preferably a thermoset material. Where the components or chips 12 are bonded to the substrate with a thermoplastic chip adhesive 14, it is preferred that the chip adhesive have a glass transition temperature ($T_g$) which is higher than $T_{g1}$. The upper sublayer 26 of the first dielectric layer 20 should be stable over a range of temperatures above $T_{g1}$, for stability during lamination to the chips in the fabrication process. It is preferred that the upper sublayer 26 be stable to at least 100° C. above $T_{g1}$. By stable, we mean the upper sublayer 26 must have sufficient viscosity that it does not shift, stretch or otherwise change in an undesirable manner during the lamination step. This upper sublayer 26 is preferably a thermoset film (for example, a KAPTON ® film). Other materials, including thermoplastics which exhibit sufficient stability, may also be used.

A second stratum 28 of the high density interconnect structure comprises a second dielectric layer 30 supporting a second patterned metallization layer 32. The dielectric layer 30 has separate lower and upper sublayers 34 and 36, respectively. The second lower sublayer 34 is a high $T_g$ thermosetting adhesive and the upper sublayer 36 is preferably a KAPTON ® resin overlay. Via holes 37 are drilled and another patterned metallization sublayer 32 extends into via holes 37 in the dielectric layer 30 to make contact with the first metallization layer 22. If desired, selected via holes may extend through the first dielectric layer 20 as well to provide direct contact to selected contact pads 12a.

The high $T_g$ thermosetting adhesive 34 is a combination of a thermoplastic material and a thermosetting material into a freestanding, B-staged, hot melt or lamination adhesive with improved processing properties over thermosetting or thermoplastic materials alone. For example, the combination of ULTEM ® resin, having a flexible polyetherimide structure, with an cross-linkable epoxy creates a high $T_g$ material which is thermosetting and can be applied by hot melt application. Other examples include combining XU-218 polyimide (available from Ciba-Geigy, Ardsley, N.Y.), with a crosslinkable epoxy (such as a cycloaliphatic epoxy CY179 from Ciba-Geigy, or cycloaliphatic epoxy ERL 4221 from Union Carbide, Danbury, Conn.). Suitable curing agents for these epoxies include Lewis acids, various metal cation salt curing agents, Octacat (a trademark of the General Electric Co., Waterford, Silicon Products Department), organic titanates, copper naphthenate, and many other curing agents and their equivalents known in the art. This lamination can be carried out at 200° C., still within the required processing temperature range. However, once this material, a combination of thermoplastic and thermosetting materials, is laminated (cured) the $T_g$ increases, and creates a temperature and solvent resistant second stratum.

In accordance with the invention, a third stratum of the high density interconnect structure comprises a solvent-soluble release layer 38. The solvent-soluble release layer 38 is a polymer which is soluble in a solvent which has no adverse effects on the portions of the multichip module 10, processed to the second stratum 28. This layer provides the ability to quickly, cleanly and easily remove any additional layers which are laminated above the solvent-soluble release layer 38. The polymer material of this layer must be soluble in solvents which will not attack the processed module 10, and should have a sufficiently high $T_g$ to prevent softening during processing of strata more removed from the substrate.

The solvent-soluble release layer 38 of the present invention must meet several requirements. Firstly, the release layer 38 must adhere well to materials such as alumina, gallium arsenide, silicon nitride, several metals, and polyimides such as KAPTON ® resin films. Secondly, the layer 38 must be compatible with the process steps inherent in the manufacturing of the high density interconnect structure. This process compatibility includes the ability to not substantially deform at temperatures of 120° C., as well as at a processing temperature of approximately 190° C. The solvent-soluble release layer 38 must also be laser ablatable or should be rendered laser ablatable in accordance with U.S. patent application Ser. No. 456,421, entitled, "Laser Ablatable Polymer Dielectrics and Methods," herein incorporated by reference, in its entirety. One such release layer material is the aforementioned XU-218 polyimide, which is soluble in cyclohexanone and has a $T_g$ of 320° C. This material, and these release polymers in general, can be applied from solution by conventional spin and spray techniques. Other polymers such as polysulfones, polyesters, certain acrylics and other polymer blends can be used as solvent-soluble release layers.

In use, after bake-out to remove the coating solvent from the solvent-soluble release layer, at least one additional stratum, such as a fourth stratum 40, of the high density interconnect structure is attached to layer 38. The fourth stratum 40 of the high density interconnect structure comprises a fourth dielectric layer 42 supporting a fourth patterned metallization layer 44. The dielectric layer 42 has separate lower and upper sublayers 46 and 48, respectively. The fourth lower dielectric sublayer is preferably a SPIE thermosetting adhesive, having a lower $T_g$ than both the $T_g$s of the materials used for either of the first two strata 18 and 28, as well as the $T_g$ used for the solvent-soluble release layer 38. The fourth stratum also comprises a third patterned metallization layer 44. The fourth upper dielectric sublayer 48 may again be a thermoset material or a thermoplastic material and is preferably a thermoset material, or KAPTON ® film. Lamination of this fourth stratum 40 is followed by via drilling which extends vias 49 through the stratum 40 and solvent-soluble release layer 38 such that the patterned metallization layer 44 will connect to the metal layer 32 of the second dielectric layer 28.

Additional (fifth, sixth, etc.) strata of the high density interconnect structure are not shown in FIG. 1, but, if used, will be (HDI) essentially identical to the lower strata 18 and 28, except with respect to layer $T_g$s. Each additional upper stratum would comprise a dielectric layer having a thermosetting adhesive (preferably a SPIE blend) and having via holes therein, and a patterned metallization layer making contact with the patterned metallization of the next lower patterned metallization layer through the via holes. Other strata can be added in accordance with the above description.

At this point the module is complete; various metallization layers 22, 32, 44 will carry power, ground, and at least one set of signal conductors. The benefit of this structure is that, after fabrication through the first two layers ( e.g. including ground and power conductor layers) the module can be pre-tested to ensure that all chips are working properly. Then, after the upper strata are laminated, the module can be finally tested and any detected problem is ensured to be in the top strata and, as such, the module incorporating the solvent-soluble release layer 38 can be reworked. The relatively high $T_g$s of the first two strata will prevent any shifting of material if any reworking is necessary. There are two modes of reworking the module. The first mode involves heating the module to 225° C., and peeling off the KAPTON ® film of the stratum directly above the release layer. The SPIE adhesive layer is soft at this temperature and allows for separation of the KAPTON ® film overlay. After cooling to room temperature, the substrate is partially covered with residual SPIE adhesive layer (insoluble) on top of the release layer 38. The module can be immersed in an appropriate solvent to dissolve the release layer and hence float off the insoluble polyimide/epoxy. Upon rinsing, a clean module comprising the first two strata 18 and 28 are revealed. Two new strata 38 and 40 can be added to the module for very quick repair. The second and alternative removal approach is to just soak the laminated part in an appropriate solvent to dissolve the release layer and float off the KAPTON ® resin film and crosslinked polyimide/epoxy. This reworkability provides for pretesting of the power and ground layers prior to additional strata being added and quick design change of the additional signal layers.

In this structure, the SPIE crosslinking copolymer blend adhesive materials used as the lower dielectric sublayer in the fourth and higher strata are selected so that these adhesive materials become set at a low enough temperature that curing the adhesive materials has no adverse effect on the high density interconnect structure or the electronic components being connected thereby. Correct selection of the curing properties of the adhesive materials allows the structure to be fabricated and, if need be, disassembled and reassembled without an adverse effect on the electronic components being interconnected.

There are some applications which require low temperature processing in order to protect sensitive components. For example, chips of certain semiconductors (GaAs, InSb and HgCdTe) are very sensitive to processing in high temperature regimes. For fabrication of multichip modules incorporating a high density interconnect structure which require processing at temperatures below 200° C., a solvent-soluble release layer is disposed between the first stratum of the high density interconnect structure and the chips mounted in the substrate. In this approach, the adhesive used for the first dielectric layer, and all other dielectric layers, can be a thermoset adhesive. This allows all layers to be laminated at temperatures 200° C. or below.

Figure 2:
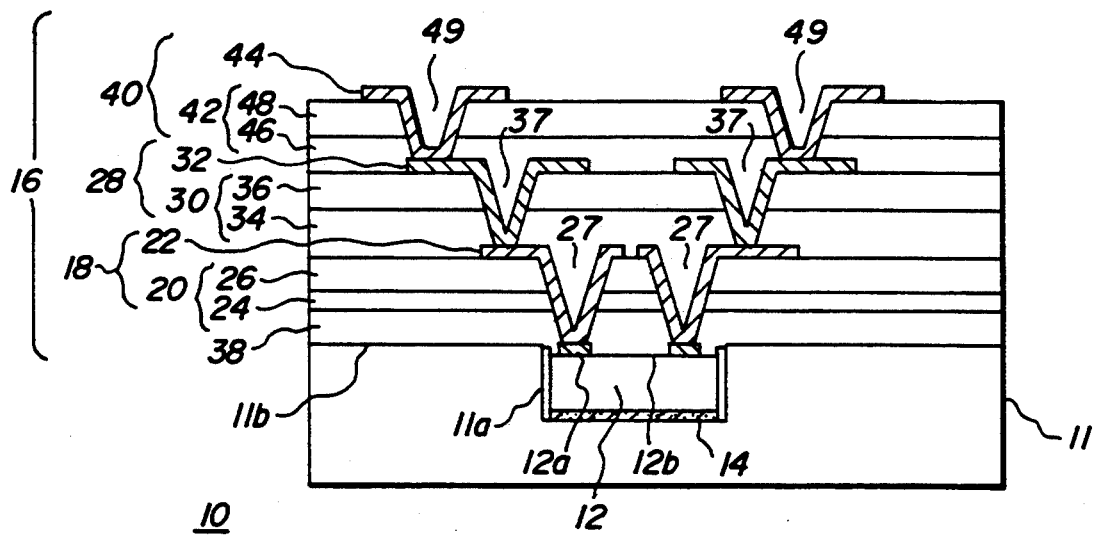
FIG. 2 is a cross-sectional view of a multichip module incorporating a high density interconnect structure having a solvent-soluble release layer between the substrate and the first stratum.

A multichip module incorporating a high density interconnect structure, capable of being completely processed at temperatures of less than 200° C., is shown in a crossection view in FIG. 2. This low temperature (HDI) structure 10 comprises a substrate 11 having cavities 11a in the upper surface thereof 11b in which integrated chips 12 or other electronic components are disposed. For many high density structures, these electronic components are bonded to the substrate with a thermoplastic adhesive 14. These electronic components have contact pads 12a on an upper contact surface thereof 12b. A first stratum 38 of the overlying high density interconnect structure 16 comprises a solvent-soluble release layer. This layer is a polymer material which must be soluble in solvents which will not attack the processed module at this point, and should have a sufficiently high $T_g$ to prevent softening during additional upper layer processing. One such material is the aforementioned polyimide XU-218; this polyimide is soluble in cyclohexanone and has a $T_g$ value of 320° C. The solvent-soluble release polymer is sprayed or spin coated as layer 38, and baked to remove solvent.

A second stratum of the high density interconnect structure 16 comprises a first dielectric layer 20 supporting a first patterned metallization layer 22. The dielectric layer has separate lower and upper sublayers 24 and 26, respectively. The lower sublayer 24 is again a thermoset material and is preferably a SPIE copolymer blend. Since the material of this lower sublayer 24 is a thermosetting polymer, and therefore changes solubility properties, as well as its $T_g$ value, upon curing, laminating multiple layers does not affect lower layers.

The upper sublayer 26 may again be a thermoset material or a thermoplastic material and is preferably a thermoset material (e.g., KAPTON ® resin film). The patterned metallization 22 extends into via holes 27 in the dielectric layer 20 to make electrical contact with the contact pads 12a.

A third stratum of the high density interconnect structure 16 comprises a dielectric layer 30 supporting a patterned metallization layer 32. The dielectric layer 30 has separate lower and upper sublayers 34 and 36. The third lower sublayer 34 is preferably an SPIE crosslinking copolymer blend. The third upper dielectric sublayer 36 may again be a thermoset material or a thermoplastic material and is preferably a thermoset KAPTON ® film.

Figure 3:
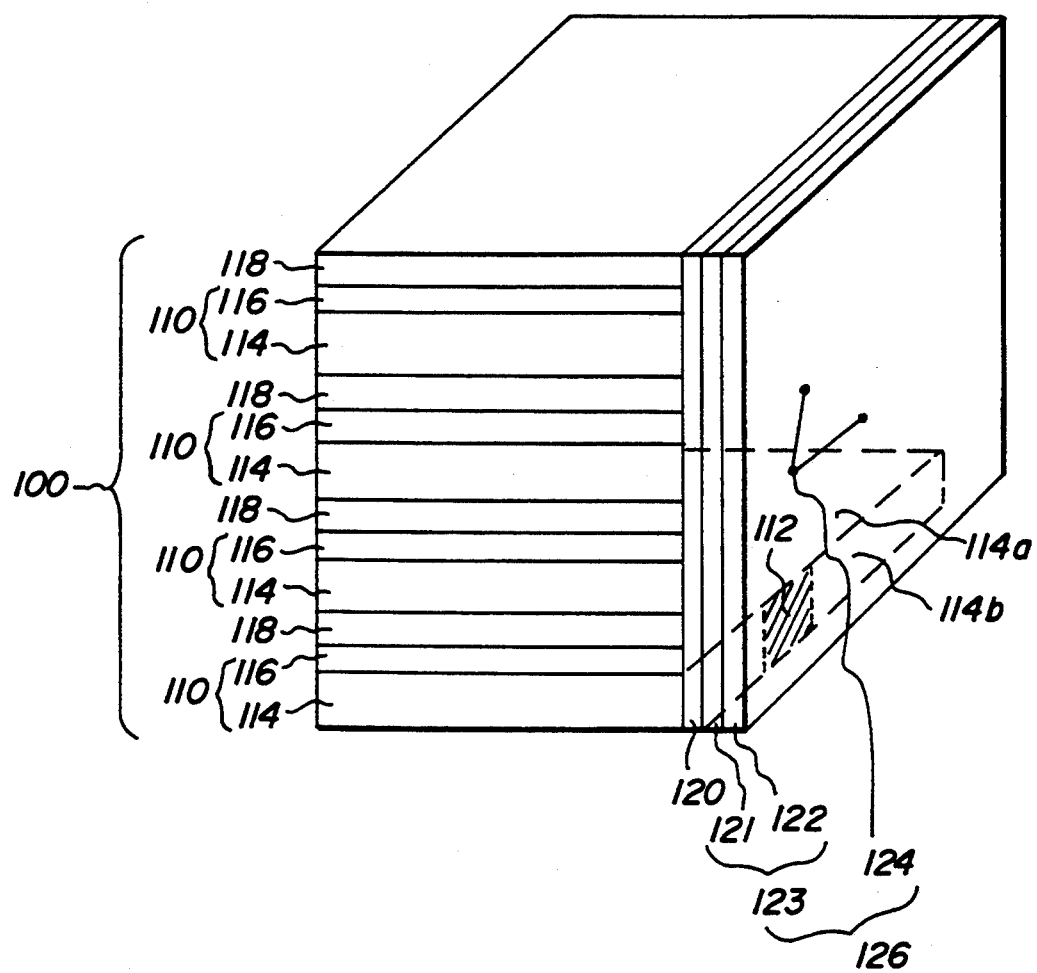
FIG. 3 is a cross-sectional view of a stack of multichip modules having a first solvent-soluble release layer used to bond together the individual modules into a stack, as well as a second solvent-soluble release layer used to bond to the stack a side stratum of high density interconnect material.

FIG. 3 shows another aspect of the present invention, specifically, an assembly 100 of stacked and joined multichip modules 110, each module 110 incorporating a high density interconnect structure 116. The assembly 100 is a 3D-HDI structure. Each of the modules 110 has a substrate 114 which has a plurality of metal edge connection pads 112; at each pad the metallization is wrapped from the top substrate surface 114a around to the substrate edge 114b. The stacked modules 110 are joined to one another by use of another solvent-soluble release layer 118 located between facing surfaces of each adjacent pair of modules. Edge connection pad metallization 112 is electrically connected to the high density interconnect structure 116 of each module 110. The high density interconnect structure 116 comprises metal distribution lines that extend to the integrated circuits and other electronic component chips mounted in the substrate 114, in manner as described above. The metal edge connection pads 112 can be fabricated by a variety of different techniques using a variety of different metals explicitly described in U.S. Pat. No. 5,107,586, entitled "Method for Interconnecting a Stack of Integrated Circuits at a Very High Density" herein incorporated in its entirety by reference.

The adhesive used to bond the separate modules 110 together into assembly 100, is a solvent-soluble release layer 118 soluble in an appropriate solvent. The HDI substrates are stacked in an alignment jig, with their edges substantially parallel to one another with aligned common edges, and laminated together. The exact method for assembling the 3D-HDI structures is taught in U.S. Pat. No. 5,107,586, cited above.

Figure 4:
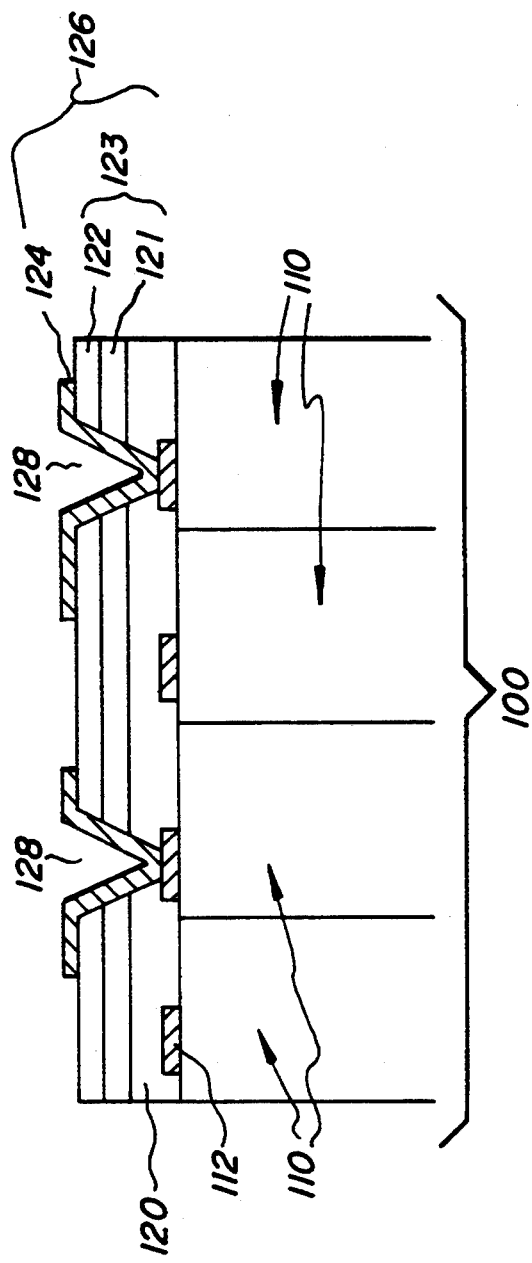
FIG. 4 is a cross-sectional view of the edge of a stack of multichip modules having a second solvent-soluble release layer used to bond a side stratum of high density interconnect material to the stack of multichip modules.

Referring now to FIG. 4, interconnections are shown between the various metal edge contact pads 112 on the edge of the assembly 100 of modules 110. In accordance with another aspect of the present invention, a solvent-soluble release layer 120 is disposed over the edge of the module assembly 100. The solvent-soluble release layer 120 may be applied by spray techniques after the individual modules have been stacked. A side stratum 126, disposed over the solvent-soluble release layer 120 has a dielectric layer 123, which is comprised of upper sublayer 122 and lower sublayer 121, respectively. The upper dielectric sublayer 122 is preferably a KAPTON ® film and is bonded to the solvent-soluble release layer 120 by an adhesive 121. The release layer prevents the epoxy from crosslinking to the substrate material. The release layer 120 allows the adhesive 121 to be removed along with the dissolution of the release layer 120. The adhesive 121 can be either a thermosetting material or a thermoplastic material, but is preferably thermosetting material such as a SPIE blend. The dielectric layer 123 has via holes 128 disposed both through the dielectric layer 122 and the release layer 120, in alignment with at least some of the metal edge connection pads 112. A patterned metallization layer 124 fills these via holes 128 and makes electrical contact with associated ones of the metal edge connection pads 112.

An important advantage of this invention is the repairability of any interconnected module 110 of the stacked HDI module assembly 100. To remove the dielectric material 123, as well as the patterned metallization 124, heat is applied to the side of the assembly 100 having release layer 120, so as to raise the temperature of the side stratum 126 above the $T_g$ of the adhesive 121 on the edges of the KAPTON® resin layer 123 and allow peeling off of the KAPTON® resin layer 123. Once the KAPTON® resin layer 123 has been removed, the 3D-HDI stack 100 can be soaked in an appropriate solvent thereby making the stacked substrates separate and accessible. The solvent-soluble release layer 120 may be the same as the solvent-soluble release layer 118 or it may be different, but is preferably different. If different, the solvent used to remove the release layer 120 will have no effect on the solvent-soluble release layer 118 within each module, nor will it affect any other portion of the module. Alternatively, the stack need not be heated and may simply be immersed in a selected solvent to dissolve the solvent-soluble release layer 120 directly and thereby allowing the stacked substrates to be separated and made individually accessible.

In order to replace one of the HDI substrates in a stack assembly 100 which has been made accessible as described above, the assembly 100 is soaked in another solvent which will dissolve the release layer 118 which holds the assembly together. Upon dissolution of the release layer 118, any substrate may be removed easily and a replacement HDI substrate is then inserted into the stack 100 and the stack 100 is adhesively bonded as described above. The interconnection of a repaired stack 100' proceeds exactly the same as when creating an interconnected stacked module 100. The ability to simply remove the dielectric material 123 and patterned metallization layer 124 from the side of a module assembly 100 provides the additional feature of being able to redesign the interconnection scheme.

Figure 5:
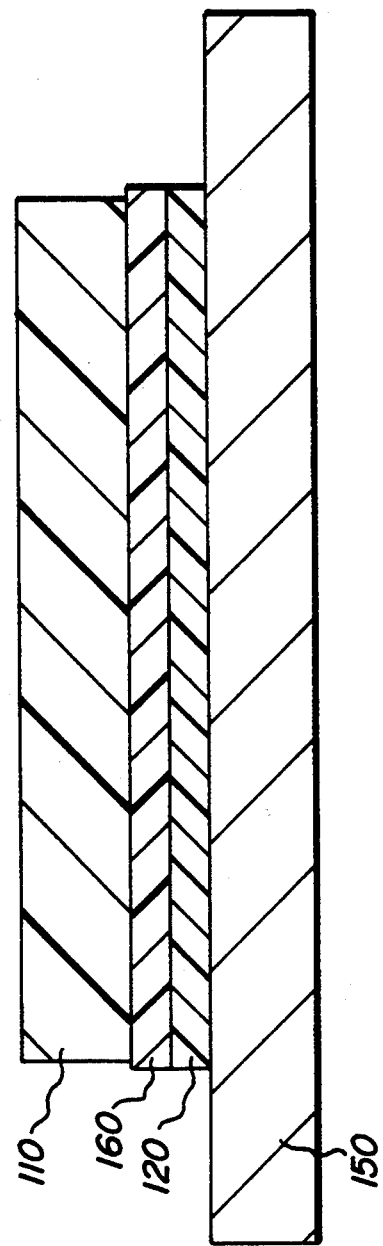
FIG. 5 is a cross-sectional view of the edge of a multichip module, incorporating a high density interconnect structure, bonded to a base with a solvent soluble release layer.

FIG. 5 shows another aspect of the present invention. In a similar manner as described above a solvent soluble release layer can be used to bond together a multichip module 110 and a base 150. The release layer 120 is used with an epoxy 160 to ensure an adequate bond between the multichip module and the release layer. Again, the module 110 and the base 150 can be separated simply by immersing the solvent soluble release layer 120 in an appropriate solvent. The base 150 typically will be a SEM-E board base.

The following illustrative examples are not intended to limit the scope of this invention but to illustrate its application and use:

EXAMPLE 1

Illustratively, a multilayer interconnect structure can be fabricated using the release layer between the first overlay layer and the chips on the substrate. The following process flow can be conducted. A polysulfone layer is coated on the chips and substrate, baked to remove the solvent, and a first layer lamination is applied using the SPIE adhesive with 1 mil thick KAPTON® film. An argon ion laser is used to drill via holes in the dielectric overlay to bond pads on the chip. Subsequently, thin Ti and Cu layers are sputtered (1000 A for each layer) and a 4 um thick Cu film is electroplated and then another sputtered Ti layer (1000 A) is applied to provide metal over the entire surface. A photoresist is coated over the metal, exposed with the same argon ion laser and developed to open up regions of the metal surface which are then wet etched to give a metal interconnect pattern on the dielectric surface connected to the bond pads. The remaining resist is removed, and another layer of KAPTON® film is laminated with the same SPIE adhesive. Vias are again drilled, metal deposited as described above, and patterned to give another layer of interconnect. Additional layers of dielectric and metal can be applied if required to complete the interconnect structure. The entire processing sequence is done at temperatures below 200° C.

The completed module is soaked for 16 hrs in acetophenone to dissolve the polysulfone release layer and allow the interconnect structure to be separated from the chips mounted on the substrate. The metallization layer bonded to the chips is broken as the interconnect structure is removed, leaving a small amount of Ti/Cu/Ti which must be removed. This can be accomplished by dipping in dilute nitric acid for a few minutes, followed by a high pressure deionized water scrub.

An alternate method of removal involves heating the completed module fabricated with the above sequence to 200° C. to soften the SPIE adhesive and peal the entire interconnect off the chips and substrate leaving the release layer exposed on the surface. The part is then soaked in acetophenone for 2 hrs at 50° C., to remove the release polymer and any residual SPIE still remaining. The release polymer is cleaned off in shorter time in this approach because the entire surfaces of the release layer is in contact with the solvent.

EXAMPLE 2

We have demonstrated that a solvent-soluble release layer can be utilized in a high density interconnect structure. A release layer was formed of a 10% by weight solution of XU-218 polyimide (available from Ciba Geigy Corp.) in cyclohexanone; this solution was coated as a film over a silicon chip mounted in a chip well on an alumina substrate. The release layer film was baked at 250° C. to remove the solvent (resulting in a thin polymer coating thickness of about 5 um). A KAPTON® resin film was then laminated using the SPIE blend as an adhesive. The lamination was carried out at 190° C. A void-free lamination, of the KAPTON® film, over the release layer, over the chip and substrate was obtained and adhesion measurements showed a pull strength of greater than 7 lbs/in, indicative of excellent adhesion. The structure was then soaked in cyclohexanone for 16 hrs which resulted in dissolution of the release layer and removal of the overlay film from substrate and the chip mounted thereon.

EXAMPLE 3

A film with the following composition was spin coated on KAPTON® film and baked at 100oC to remove the solvent:

| | | |
|---|---|---|
| 15 g | XU-218 polyimide | (Ciba-Geigy) |
| 60 g | Cyclohexanone | |
| 22.5 g | CY179 epoxy resin | (Ciba-Geigy) |
| 6 g | Xylene | |
| 0.225 g | Octacat-TM | (1 wt % of epoxy) |

| | | |
|---|---|---|
| 0.5625 g | Copper Naphthenate | (solution equivalent to 1 wt % of epoxy) |

The KAPTON ® film with the dried adhesive was then laminated in vacuum onto alumina by heating to 200° C. and holding under pressure at that temperature for ½ hr. The adhesion of the KAPTON ® film to the alumina substrate was measured to be 5 lbs.

EXAMPLE 4

Free standing films of XU-218/epoxy blends and ULTEM ®/epoxy blends were prepared by coating on teflon and baking for 10 min at 100° C., 20 min at 150° C. and 30 min at 200° C. The films could readily be peeled off the teflon and their melt flow characteristics were characterized by measuring the cut-thru temperatures. This was achieved by placing the film between two copper wires and then heating at a controlled rate. The point at which the polymer flowed causing the two wires to make contact was defined as the cut-thru temperature. The tougher, more durable the layer, the higher the cut-thru value. The same test was also run on the currently used siloxane-polyimide/epoxy material giving cut thru values as shown below:

| Sample | Cut thru Temperatures |
|---|---|
| SPI/epoxy blend | 150° C. |
| ULTEM ®/epoxy blend | 190° C. |
| XU-218 epoxy blend | 250° C. |

The films of ULTEM ®/epoxy blend or XU-218/epoxy blend were found to have improved thermal stability over the SPIE blends.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. An electronics module, incorporating a high density interconnect structure, comprising:
   a first portion having a substrate with a plurality of electronic component chips, each of said plurality of chips having contact pads disposed thereon;
   a second portion comprising at least one stratum of said high density interconnect structure with a conductive segment which is electrically connected to at least some of said contact pads disposed on said plurality of chips; and
   a release layer of a solvent-soluble material which bonds together said first portion and said second portion and allows separation of said first portion and said second portion responsive to immersion of said release layer in a solvent which dissolves the material of said release layer.

2. The electronics module according to claim 1, wherein said first portion includes at least one stratum of said high density interconnect structure with another conductive segment which is electrically connected to a selected set of said contact pads.

3. The electronics module according to claim 2, wherein said release layer is fabricated from a material selected from the group consisting of polyesters, polyimides, polysulfones, and acrylates.

4. The electronics module according to claim 2, wherein said dielectric layer in said second stratum comprises: an upper sublayer; and a lower sublayer of a high $T_g$ material.

5. The electronics module according to claim 4, wherein said lower sublayer of said second stratum is a free standing, B-staged, hot melt adhesive comprising a mixture of a polyimide and an epoxy.

6. The electronics module according to claim 1, wherein said release layer is fabricated from a material selected from the group consisting of polyesters, polyimides, polysulfones, and acrylates.

7. The electronics module according to claim 1, wherein the fabrication and rework process is carried out at temperatures not exceeding 200° C.

8. In combination, at least one electronics module according to claim 1, and at least one other module;
   each of said at least one module and said at least one other module having a selected surface bounded by an edge;
   each pair of said modules positioned with said selected surfaces thereof substantially parallel to one another and with said edges in alignment; and
   another solvent-soluble release layer located between said selected surfaces of each adjacent pair of modules for bonding together said pair of modules, and allowing separation of the modules from one another responsive to immersion of said another release layer in a solvent which (a) dissolves the material of said another release layer, and (b) does not dissolve said solvent-soluble release layer.

9. The combination of claim 8, wherein all modules of the combination include said first and second portion and said release layer therebetween.

10. The combination according to claim 9, wherein said another release layer is different from said solvent-soluble release layer and both are fabricated from a material selected from the group consisting of polyesters, polyimides, polysulfones, and acrylates.

11. An electronics assembly comprising:
    a plurality of electronics modules according to claim 1, each having a selected surface bounded by an edge, each pair of said modules positioned with said selected surfaces thereof substantially parallel to one another and with said edges in alignment; and
    another layer of the material of said solvent-soluble release layer located between said selected surfaces of each adjacent pair of modules for bonding said plurality of modules together, and allowing separation of each of said modules from one another, responsive to immersion of said another layer in a solvent which dissolves the material of said another layer.

12. An electronics assembly, comprising:
    a first portion having a plurality of multichip modules, each module having
       at least one integrated circuit thereon in electrical contact with at least some of a plurality of edge contact pads disposed at an edge of each of said plurality of modules; a high density interconnect structure;
       a selected surface bounded by said edge, each of said modules positioned with said selected surface substantially parallel to one another and with said edges in alignment;

a release layer located between said selected surfaces of each adjacent pair of modules for bonding together said plurality of modules, and allowing separation each of said plurality of modules responsive to immersion of said release layer in a solvent which dissolves the material of said release layer;

a second portion comprising at least one side stratum of a side high density interconnect structure disposed on at least one side of said first portion, where said side high density interconnect structure has at least one conductive segment which is electrically connected to at least some of said edge contact pads disposed on said modules; and another release layer of a solvent-soluble material which bonds together said first portion and said second portion and allows separation of said first portion and said second portion responsive to immersion of said another release layer in a solvent which dissolves the material of said another release layer.

13. The stack of assembled electronics modules according to claim 12, wherein both of said release layer and said another release layer are fabricated from a material selected from the group consisting of polyesters, polyimides, polysulfones, and acrylates.

14. The stack of assembled electronics modules according to claim 12, wherein said solvent-soluble release layer and said another solvent-soluble release layer are substantially identical.

15. The stack of assembled electronics modules according to claim 12, wherein said solvent-soluble release layer and said another solvent-soluble release layer are substantially different.

16. A electronics module according to claim 1 bonded to a base with another solvent soluble release layer, in conjunction with an epoxy.

17. The electronics module according to claim 16, wherein said another release layer is different from said solvent-soluble release layer and both are fabricated from a material selected from the group consisting of polyesters, polyimides, polysulfones, and acrylates.

* * * * *